United States Patent
Park et al.

[11] Patent Number: 6,166,646
[45] Date of Patent: Dec. 26, 2000

[54] VACUUM-ADSORBING APPARATUS OF SEMICONDUCTOR DEVICE FABRICATION FACILITY

[75] Inventors: Soon-jong Park; Ki-man Lyu, both of Kyungki-do, Rep. of Korea

[73] Assignee: Samsung Electronics Co., Ltd., Kyungki-do, Rep. of Korea

[21] Appl. No.: 09/167,530

[22] Filed: Oct. 7, 1998

[30] Foreign Application Priority Data

Dec. 5, 1997 [KR] Rep. of Korea .................. 97-66285

[51] Int. Cl.⁷ .................................................. G08B 21/00
[52] U.S. Cl. ............................ 340/626; 29/743; 29/832
[58] Field of Search .......................... 340/626; 29/743, 29/832

[56] References Cited

U.S. PATENT DOCUMENTS

| | | | |
|---|---|---|---|
| 4,683,654 | 8/1987 | Scholten et al. | 29/832 |
| 5,029,383 | 7/1991 | Snyder et al. | 29/740 |
| 5,475,619 | 12/1995 | Sugano et al. | 340/626 |
| 5,498,942 | 3/1996 | Ijuin | 318/567 |
| 5,761,798 | 6/1998 | Suzuki | 29/832 |

*Primary Examiner*—Edward Lefkowitz
*Attorney, Agent, or Firm*—Jones Volentine, L.L.C.

[57] ABSTRACT

A vacuum adsorbing apparatus of a semiconductor fabrication facility is characterized by the incorporation of a digital vacuum sensor into the vacuum line for sensing the mounting state of a wafer or reticle on a mounting plate (adhered to or released by) by way of sensing the pressure existing in the vacuum line. The digital sensor reliably determines the state of the wafer or the reticle relative to the mounting plate. The mounting plate can thus be prevented from being transferred when the vacuum in the mounting plate is insufficient to adhere the wafer or reticle firmly to the plate. The wafer or the reticle can thus be prevented from being damaged or broken during its transfer.

8 Claims, 3 Drawing Sheets

VACUUM-ADSORBING APPARATUS OF SEMICONDUCTOR DEVICE FABRICATION FACILITY

BACKGROUND OF THE INVENTION

1. Field of the Invention

The present invention relates to a vacuum-adsorbing apparatus of a semiconductor device fabrication facility. More particularly, the present invention relates to a vacuum-adsorbing apparatus of a robot arm which transfers reticles or semiconductor wafers to and from photolithographic equipment in a semiconductor device fabrication facility.

2. Description of the Related Art

Generally speaking, the fabricating of semiconductor devices involves subjecting a wafer to an array of processes such as cleaning, diffusion, photolithographic, etching, and ion-injection processes. The photolithographic process must be carried out before the etching or ion-injection processes. In photolithography, an image from a reticle is transferred onto the wafer using a photoresist. Photolithography can be roughly divided into four steps, namely photoresist deposition, alignment and exposure, development, and inspection.

To begin these steps, both the wafer and a reticle must be set at precise positions. In this respect, the wafer is moved from a carrier to a wafer stage by a wafer loader. On the other hand, the reticle is moved from a case to a reticle stage by a reticle loader.

Recently, wafer loaders and reticle loaders have employed vacuum-adsorption as a means to secure the wafers and reticles to a robot arm while at the same time preventing the wafers and reticles from being broken or damaged, e.g. from being scratched. The conventional wafer loader or reticle loader has a vacuum line opening into a mounting plate to which the wafer or reticle is adhered under the vacuum established in the line. In addition, a vacuum sensor is provided in the vacuum line for sensing the state of the vacuum, which information is used to adhere or detach the object (wafer or reticle) to or from the mounting plate.

FIGS. 1 and 2 show the conventional vacuum sensor. The vacuum sensor 10 has a nozzle 12 connected to the vacuum line (not shown), and a screw 14 for controlling the distance between inner contacts 18, 20 of a switch. More specifically, the vacuum sensor 10 is turned on and off electrically by a diaphragm 16 moved by the air passing through the nozzle 12. If the air is drawn out of the sensor via the nozzle 12, the diaphragm 16 pushes a movable iron plate spring 18 into contact with a fixed iron plate 20. On the other hand, if air is led back into the sensor via the nozzle 12, the diaphragm 16 is relaxed, and the iron plate spring 18 springs back to its original position so as to be detached from the fixed iron plate 20.

The vacuum sensor outputs an electric sensing signal indicative of the existence/non-existence of a vacuum according to the state (contact/non-contact) between the fixed iron plate 20 and the movable iron plate spring 18. In addition, the fixed iron plate 20 can be re-positioned by the screw 14 to adjust the spacing between the fixed iron plate 20 and the movable iron plate spring 18, and hence, the sensitivity of the sensor.

However, because the vacuum sensor comprises mechanical contacts, the sensitivity of the sensor degrades over time. In fact, such a sensor is prone to failures or malfunctions, whereby an operator can not tell whether the wafer or reticle is adhered sufficiently, or at all, to the robot arm. When such a sensing error occurs, the wafer or reticle can be shook or can even fall from the robot arm and become scratched or broken.

SUMMARY OF THE INVENTION

Therefore, an object of the present invention is to substantially overcome one or more of the problems, limitations and disadvantages of the related art by providing a vacuum adsorbing apparatus of a semiconductor device fabrication facility which can reliably sense the mounting state of an object relative to a mounting plate on which the object is resting.

To achieve these and other objects, the vacuum adsorbing apparatus of the present invention facility is characterized by the incorporation of a digital vacuum sensor into the vacuum line for sensing the mounting state of the object on the mounting plate by way of sensing the pressure existing in the vacuum line.

A standard voltage supply outputs a standard voltage of a certain level. A comparator compares the voltage level of a signal produced by the digital vacuum sensor and the standard voltage. Based on this comparison, the comparator outputs a comparison signal indicative of the state of the mounting plate.

A switching means switches between two different states in dependence on the output of the comparator. The switching means preferably comprises a resistor. A controller controls the operation of the mounting plate, e.g. the driving of the robot arm to which the chuck comprising the mounting plate is mounted, according to the signal issued by the switching means.

An alarm is provided by which the state of the object relative to the mounting plate can be perceived by an operator. The alarm can be in the form of a light or an audio device turned on and off by the signals selectively issued by the switching means, respectively.

BRIEF DESCRIPTION OF THE DRAWINGS

These and other objects, features and advantages of the present invention will become clearer from the following detailed description of preferred embodiments thereof made with reference to the accompanying drawings, of which.

DETAILED DESCRIPTION OF THE PREFERRED EMBODIMENTS

Figure 1:
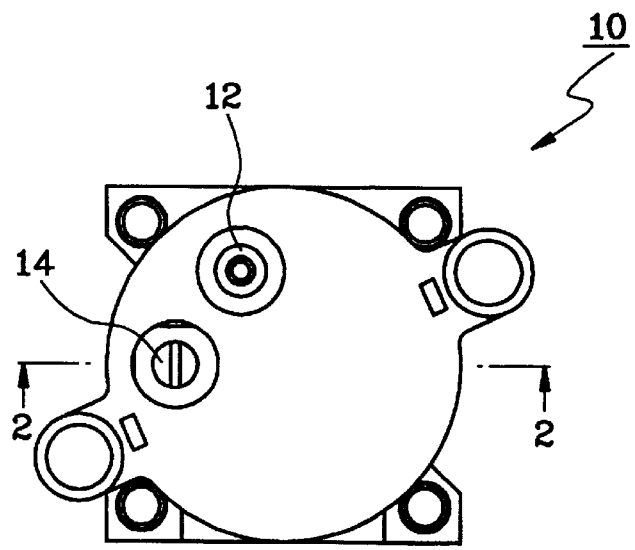
FIG. 1 is a plan view of a conventional mechanical vacuum sensor of a vacuum adsorbing apparatus used in a semiconductor device fabrication facility.
Figure 2:
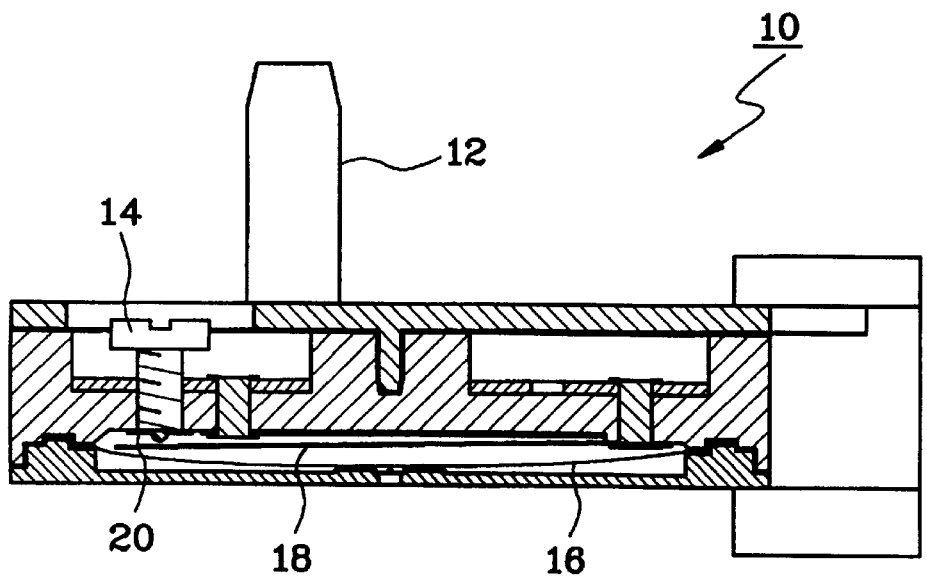
FIG. 2 is a sectional view of the conventional mechanical vacuum sensor taken along line 2—2 in FIG. 1.
Figure 3:
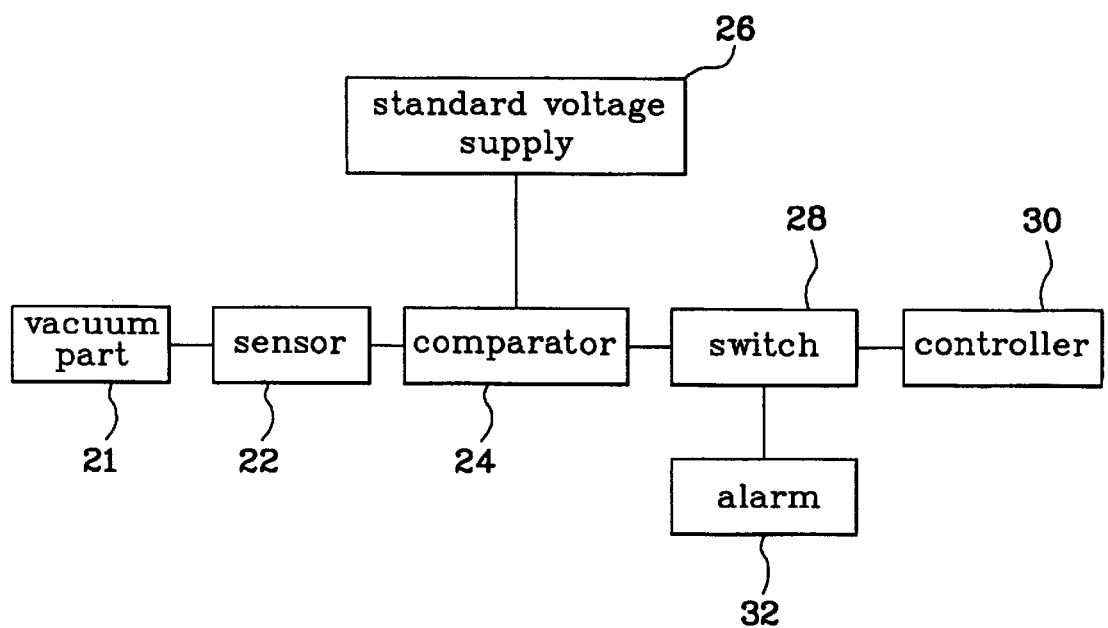
FIG. 3 is a block diagram of an embodiment of the vacuum adsorbing apparatus of the semiconductor device fabrication facility according to the present invention.

FIG. 3 shows the general make-up of the vacuum adsorbing apparatus of the present invention. Reference numeral 21 designates a vacuum part, such as a mounting plate, of a wafer or reticle chuck. A sensor 22 is provided for sensing the pressure existing in the vacuum part 21 of the chuck, and hence yields an indication of whether an object will adhere to the vacuum part 21. The sensor 22 is, in turn, connected to a comparator 24. A standard voltage supply 26 supplies a standard voltage to the comparator 24, whereby the comparator 24 compares the voltage of a signal issued by the sensor 22 to the standard voltage. A switch 28 is connected to the comparator 24, and a controller 30 is, in turn, connected to the switch 28. In addition, an alarm 32 is connected to the switch 28 for issuing an alarm when the switch 28 is activated a certain way.

In operation, the sensor 22 senses the pressure in the vacuum part 21 (vacuum/non-vacuum state), and issues a sensing signal having a voltage indicative of the pressure. The voltage level of the sensing signal and the standard voltage are compared by the comparator 24. The comparator 24 the issues a signal, based on this comparison, to the switch 28.

The switch 28 selects a driving voltage based on the signal produced by the comparator. The driving voltage is applied to a controller 30 as either a high or low level signal indicative of the state of the vacuum in the vacuum part 21.

The high level signal is sufficient to cause the controller 30 to drive the chuck comprising the vacuum part 21 and to perform any control operation related to the driving of the chuck. In addition, the apparatus includes an alarm 32 connected to the switch 28 so as to be selectively turned on and off thereby.

Figure 4:
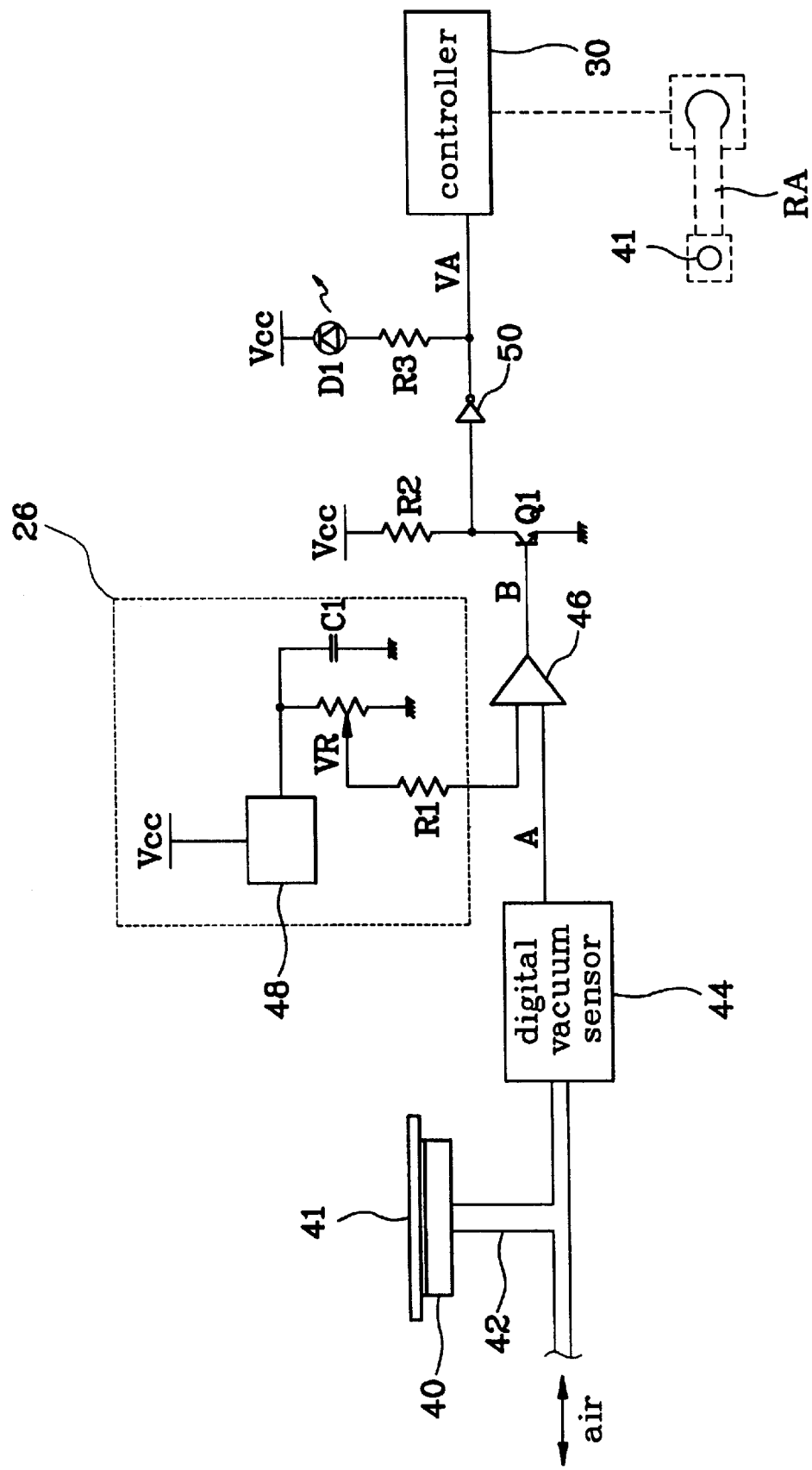
FIG. 4 is a circuit diagram of the vacuum adsorbing apparatus of the semiconductor device fabrication facility according to the present invention.

FIG. 4 shows the structure of the present invention in more detail, i.e. shows an example of the elements described above with reference to the block diagram of FIG. 3.

Referring to FIG. 4, a vacuum line 42 is connected to a mounting plate 40 on which a wafer 41 is mounted. The mounting plate 40 has passages communicating with the vacuum line 42 so that when a vacuum is established in the vacuum line 42, the wafer 41 adheres to the mounting plate 40 at the top surface thereof. A digital vacuum sensor 44 is provided at the end of a line connected to the vacuum line 42, in parallel with the vacuum line 42.

The digital vacuum sensor 44 has an output terminal, and a pressure sensor which produces a signal of a voltage proportional to the pressure (degree of vacuum) existing in the vacuum line 42. This signal is output via the output terminal. The digital vacuum sensor 44 also has an amplifier which amplifies the signal produced by the pressure sensor. It is this amplified signal that is output. Accordingly, it is not necessary to adjust the sensitivity of the sensor.

The output of the digital vacuum sensor 44, i.e. the sensing signal (A), is applied to one input terminal of the comparator 46. The standard voltage is applied to the other input terminal from the standard voltage supply 26. In the standard voltage supply 26, a supply voltage (Vcc) is applied to a voltage stabilizer 48. The voltage stabilizer 48 stabilizes the Vcc, and compensates the signal level. The voltage output from the voltage stabilizer 48 is applied across a variable resistor (VR), and the signal level is smoothed by a capacitor (C1) connected in parallel with the variable resistor (VR).

A resistor (R1) is connected in parallel to the resistor (VR). The resistor (R1) is connected to the other terminal of the comparator 46 so that a standard voltage is applied thereto. The standard voltage refers to that voltage which is output from the voltage stabilizer 48, is applied across the variable resistor (VR) where it is partially divided, and which is finally applied across the resistor (R1).

The output terminal of the comparator 46 is connected to the base of a transistor (Q1). A supply voltage (Vcc) is applied to the collector of the transistor (Q1) via a resistor (R2). An adsorbing confirmation signal (VA) is issued to the controller 30 via an inverter 50, which is connected to the collector of the transistor (Q1).

The adsorbing confirmation signal (VA) output via the inverter 50 is applied across an anode of a light emitting diode (D1). A supply voltage (Vcc) is applied across a resistor (R3) connected in series to the cathode of the light emitting diode (D1). The light emitting diode (D1) is turned on or off depending on the voltage level of the adsorbing confirmation signal (VA) applied across the anode thereof.

Now, the operation of the present invention will be described in even greater detail.

When the wafer 41 is to be exposed, the wafer is moved from a carrier to a stage by a robot arm RA. After the wafer 41 is exposed to an image of a reticle, the wafer 41 is moved by the robot arm RA from the stage to the carrier. In both cases, the wafer 41 is mounted on a mounting plate 40 of the robot arm RA as it is being transferred. In this respect, air in the vacuum line 42 is discharged so that the wafer 41 positioned on the upper surface of the mounting plate 40 is adhered to the mounting plate 40 by the vacuum created in the line 42.

The digital vacuum sensor 44 outputs the sensing signal (A) corresponding to the degree of vacuum to which the wafer 41 is exposed via the top surface of the mounting part 40 (in this case a high signal level), and the comparator 46 compares the standard voltage and the voltage level of the sensing signal (A).

The voltage level of the sensing signal (A) is determined by the comparator 46 to be higher than the standard voltage. Therefore, a high level comparison signal (B) is issued from the comparator 46 to the base of the transistor (Q1).

The transistor (Q1) is thus turned on, and a low level voltage applied to the input terminal of the inverter 50. The adsorbing confirmation signal (VA) output from the controller 30 is thus of a high level, and drives the robot arm RA to which the wafer 41 is mounted.

When the adsorbing confirmation signal (VA) is of a high level, the light emitting diode (D1) will not light up because of the small voltage difference between the voltage across the anode and the supply voltage (Vcc) across the cathode of the light emitting diode.

Meanwhile, once the wafer 41 has been moved to a desired position, air is introduced into the vacuum line 42, whereby the level of the vacuum existing in the vacuum line 42 is decreased. Accordingly, the wafer 41 is released from the mounting plate 40.

At this time, a sensing signal (A) of a lower level voltage than the standard voltage is applied to the comparator 46. As a result, the comparator 46 outputs a low level comparison signal (B). Accordingly, the transistor (Q1) is turned off, the supply voltage (Vcc) is applied across the resistor (R2), and a high level voltage is applied across the input terminal of the inverter 50.

As a result, the inverter 50 outputs a low level adsorbing confirmation signal (VA). This low voltage is applied across the anode of the light emitting diode (D1). Accordingly, the light emitting diode D1 is lit.

In the present invention described above, because the pressure in the vacuum line 42 is sensed by a digital sensor, it is not necessary to adjust the sensor to increase its sensitivity, and a precise measure of the pressure is constantly output.

In addition, because the standard voltage used by the comparator is one that has been stabilized, the apparatus produces a signal which is an accurate representation of whether the wafer or reticle is adhered to the mounting plate of the vacuum chuck.

In addition, because a light emitting diode or a speaker of an audio device is connected in the circuit of the vacuum apparatus, the state of the wafer or reticle can be easily perceived (seen or heard) by an operator.

Therefore, because the state of the wafer or the reticle relative to the mounting plate is reliably determined by the present invention, the wafer or the reticle can be prevented from being damaged or broken during its transfer. The present invention thus facilitates production control and contributes to sustaining a high production yield.

Finally, although the present invention has been described in detail above, various changes, substitutions and alterations thereto will become apparent to is those of ordinary skill in the art. For instance, although the present invention has been described in connection with the photolithographic equipment of the semiconductor fabrication facility, it is not limited to such a use. Rather, the present invention can be applied to any of various pieces of equipment in the semiconductor device fabrication facility. Accordingly, all such changes, substitutions and alterations are seen to be within the true spirit and scope of the invention as defined by the appended claims.

What is claimed is:

1. A vacuum adsorbing apparatus of a semiconductor device fabrication facility, comprising:
    a vacuum line;
    a mounting plate to which an object is to be mounted, s aid mounting plate being connected to said vacuum line so as to produce a pressure corresponding to that existing in said vacuum line to adhere the object thereto;
    a digital vacuum sensor mounted in said vacuum line that senses the pressure existing in said vacuum line;
    a standard voltage supply that outputs a standard voltage; and
    a comparator, operatively coupled to said digital vacuum sensor and to said standard voltage supply, that compares a signal output by said digital vacuum sensor that is indicative of the pressure existing in said vacuum line and the standard voltage, and that outputs a signal indicative of whether a vacuum sufficient to adhere the object to said mounting plate exists in said vacuum line, based on the comparison.

2. The vacuum adsorbing apparatus of a semiconductor device fabrication facility of claim 1 further comprising:
    a switch that selectively switches between states in which different signals are output therefrom, based on the signal output by said comparator; and
    a controller, operatively coupled to said switch and said mounting plate, that executes a control operation according to the signals selectively output by said switch.

3. The vacuum adsorbing apparatus of a semiconductor device fabrication facility of claim 2, wherein said switch comprises:
    a transistor switchable to an on or off state depending on a level of the signal output by said comparator; and
    an inverter, coupled between said transistor and said controller, that inverts a voltage level of a driving voltage produced by said transistor according to the state thereof.

4. The vacuum adsorbing apparatus of a semiconductor device fabrication facility of claim 2, further comprising an alarm, operatively coupled to said switch, that is activated upon receipt of a respective one of the signals output by said switch.

5. The vacuum adsorbing apparatus of a semiconductor device fabrication facility of claim 4, wherein said alarm comprises a light.

6. The vacuum adsorbing apparatus of a semiconductor device fabrication facility of claim 1, wherein said standard voltage supply comprises a variable resistor coupled to a voltage source, said variable resistor selectively provides the standard voltage.

7. The vacuum adsorbing apparatus of a semiconductor device fabrication facility of claim 1, wherein said standard voltage supply comprises a voltage stabilizer coupled to a voltage source, said voltage stabilizer compensates a level of the voltage source to provide a stabilized voltage level as the standard voltage.

8. The vacuum adsorbing apparatus of a semiconductor device fabrication facility of claim 1, wherein said digital vacuum sensor generates a sensor signal based on the pressure existing in the vacuum line and amplifies the sensor signal, the amplified sensor signal being provided as the signal output by said digital vacuum sensor.

* * * * *